(12) United States Patent
Noma et al.

(10) Patent No.: US 8,693,157 B2
(45) Date of Patent: Apr. 8, 2014

(54) SUBSTRATE INCLUDING AN ESD PROTECTION FUNCTION

(75) Inventors: Takashi Noma, Nagaokakyo (JP); Jun Urakawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/915,119

(22) Filed: Oct. 29, 2010

(65) Prior Publication Data

US 2011/0038088 A1   Feb. 17, 2011

Related U.S. Application Data

(63) Continuation of application No. PCT/JP2009/057700, filed on Apr. 16, 2009.

(30) Foreign Application Priority Data

May 8, 2008 (JP) .................................. 2008-122801

(51) Int. Cl.
*H02H 7/20* (2006.01)

(52) U.S. Cl.
USPC ........................................................ 361/112

(58) Field of Classification Search
USPC .................................. 361/112, 56
See application file for complete search history.

(56) References Cited

U.S. PATENT DOCUMENTS

| | | | |
|---|---|---|---|
| 4,586,105 A | 4/1986 | Lippmann et al. | |
| 6,067,003 A * | 5/2000 | Yang | 337/28 |
| 7,085,118 B2 | 8/2006 | Inoue et al. | |
| 7,277,003 B2 * | 10/2007 | Inoue et al. | 338/20 |
| 7,633,735 B2 * | 12/2009 | Urakawa | 361/112 |
| 2002/0008952 A1 * | 1/2002 | Shin | 361/112 |
| 2004/0089472 A1 * | 5/2004 | Ninomiya et al. | 174/266 |
| 2004/0125530 A1 | 7/2004 | Tominaga et al. | |
| 2004/0257740 A1 * | 12/2004 | Block et al. | 361/112 |
| 2005/0143262 A1 * | 6/2005 | Hirose et al. | 505/100 |
| 2006/0209485 A1 * | 9/2006 | Imai et al. | 361/120 |
| 2008/0160929 A1 | 7/2008 | Lee | |
| 2008/0192401 A1 | 8/2008 | Terada | |
| 2010/0046130 A1 * | 2/2010 | Park et al. | 361/56 |
| 2010/0254052 A1 * | 10/2010 | Katsumura et al. | 361/56 |

(Continued)

FOREIGN PATENT DOCUMENTS

| | | |
|---|---|---|
| CN | 1542873 A | 11/2004 |
| CN | 1783708 A | 6/2006 |

(Continued)

OTHER PUBLICATIONS

Official Communication issued in International Patent Application No. PCT/JP2009/057700, mailed on Jul. 14, 2009.

(Continued)

*Primary Examiner* — Rexford Barnie
*Assistant Examiner* — Angela Brooks
(74) *Attorney, Agent, or Firm* — Keating & Bennett, LLP

(57) ABSTRACT

A substrate including an ESD protection function includes an insulating substrate, at least one of circuit elements or a wiring pattern and an ESD protection portion. In the ESD protection portion, facing portions of at least one pair of discharge electrodes are disposed in a cavity provided in the insulating substrate so that the ends face each other. The discharge electrodes are electrically connected to the circuit elements and or the wiring pattern.

9 Claims, 9 Drawing Sheets

(56) References Cited

U.S. PATENT DOCUMENTS

| | | | |
|---|---|---|---|
| 2011/0002075 A1* | 1/2011 | Asakawa et al. | 361/111 |
| 2011/0007438 A1* | 1/2011 | Ito et al. | 361/56 |
| 2011/0216456 A1* | 9/2011 | Yamamoto et al. | 361/56 |

FOREIGN PATENT DOCUMENTS

| | | | |
|---|---|---|---|
| CN | 1942042 A | | 4/2007 |
| CN | 101176266 A | | 5/2008 |
| EP | 0 211 517 A2 | | 2/1987 |
| JP | 62-35480 A | | 2/1987 |
| JP | 8-83670 A | | 3/1996 |
| JP | 8-236260 A | | 9/1996 |
| JP | 10-69961 A | | 3/1998 |
| JP | 2000-173743 A | | 6/2000 |
| JP | 2000-353583 A | | 12/2000 |
| JP | 2001-43954 A | | 2/2001 |
| JP | 2001-143846 A | | 5/2001 |
| JP | 2002-35202 A | | 2/2002 |
| JP | 2003-283362 A | | 10/2003 |
| JP | 2003-297524 A | | 10/2003 |
| JP | 2004-127614 A | | 4/2004 |
| JP | 2004-214005 A | | 7/2004 |
| JP | 2004-311877 A | | 11/2004 |
| JP | 2005-276666 A | | 10/2005 |
| JP | 2005-302942 A | | 10/2005 |
| JP | 2007-227259 A | | 9/2007 |
| KR | 10-2004-0089550 A | | 10/2004 |

OTHER PUBLICATIONS

Official Communication issued in corresponding European Patent Application No. 09742660.5, mailed on Feb. 6, 2013.
Official Communication issued in corresponding European Patent Application No. 09742660.5, mailed on Sep. 24, 2013.

* cited by examiner

SUBSTRATE INCLUDING AN ESD PROTECTION FUNCTION

BACKGROUND OF THE INVENTION

1. Field of the Invention

The present invention relates to a substrate including an electrostatic discharge (ESD) protection function.

2. Description of the Related Art

ESD refers to a phenomenon in which an intense electrical discharge occurs when electrically charged conductive substances (e.g., a human body) contact or sufficiently approach other conductive substances (e.g., electronic devices). ESD causes problems, such as damage to electronic devices or malfunction thereof. In order to prevent these problems, an excessive voltage generated during discharge must be prevented from being applied to the circuits of electronic devices. For such a purpose, an ESD protection device is used, which is also referred to as a surge absorption element or a surge absorber.

The ESD protection device is disposed, for example, between a signal line and a ground of a circuit. The ESD protection device includes a pair of discharge electrodes that are arranged so as to face each other with a space therebetween, and the pair of electrodes has a high resistance in normal use and such that a signal does not flow to a ground side. In contrast, when an excessive voltage is applied, such as when static electricity is applied from an antenna of a cellular phone, for example, discharge occurs between the discharge electrodes of the ESD protection device, and thus, static electricity flows to the ground side. Thus, a voltage generated by static electricity is not applied to a circuit arranged downstream of the ESD device, and thus the circuit is protected.

For example, in an ESD protection device shown in an exploded perspective view of FIG. 18 and in a cross sectional view of FIG. 19, a cavity 5 is provided in a ceramic multilayer substrate 7 in which two or more insulating ceramic sheets 2 are laminated, discharge electrodes 6 electrically connected to external electrodes 1 are arranged to face each other in the cavity 5, and a discharge gas is enclosed in the cavity 5. When a voltage causing dielectric breakdown between the discharge electrodes 6 is applied, discharge occurs between the discharge electrodes 6 in the cavity 5. The discharge leads an excessive voltage to the ground, and thus, a circuit arranged downstream of the ESD protection device is protected (e.g., Japanese Unexamined Patent Application Publication No. 2001-43954).

However, when the ESD protection device is mounted, a space for the ESD protection device is required, which makes it difficult to reduce the size of a circuit. Moreover, the wiring distance from the ESD protection device to electronic circuits or electronic components to be protected is relatively long, and thus, the ESD protection performance is not sufficiently ensured because of the influence of wiring impedance.

SUMMARY OF THE INVENTION

To overcome the problems described above, preferred embodiments of the present invention provide a structure in which the size of a circuit can be easily reduced and the ESD protection function can be sufficiently provided.

A substrate including an ESD protection function includes an insulating substrate including at least one of a circuit element or a wiring pattern, at least one cavity provided in the insulating substrate, and at least one pair of discharge electrodes including facing portions arranged in the cavity such that ends of the facing portions face each other with a space therebetween and being electrically connected to the circuit element or the wiring pattern.

Due to the fact that the facing portions of the discharge electrodes are arranged in the cavity in the insulating substrate, an ESD protection portion is provided. More specifically, when a voltage exceeding a given voltage is applied between the discharge electrodes, the space between the ends of the facing portions of the discharge electrodes is short-circuited, and functions as an ESD protection portion.

Compared with a case in which a separate and independent ESD protection device is used, a mounting area is significantly reduced by integrating the ESD protection portion and the insulating substrate, and thus, a reduction in the size of the circuit is facilitated. Moreover, the wiring distance can be shortened and the ESD protection function can be effectively ensured.

Moreover, since the separate and independent ESD protection device is also produced using a substrate, a substrate including an ESD protection function can be produced by integrating the ESD protection portion and the insulating substrate without increasing the number of processes.

Preferably, the insulating substrate includes a mixed portion. The mixed portion is arranged near the surface in which the discharge electrodes are provided, the mixed portion is disposed adjacent to at least the facing portions of the discharge electrodes and a portion between the facing portions. The mixed portion preferably includes a metal material and an insulating material defining the insulating substrate.

The mixed portion is disposed between the facing portions of the discharge electrodes and the insulating substrate. Since the mixed portion includes metal materials that are the same or substantially the same as the materials used for the discharge electrodes and insulating materials that are the same or substantially the same as the materials used for the insulating substrate, the coefficient of thermal expansion of the mixed portion can be adjusted to an intermediate value between the coefficient of thermal expansion of the facing portions of the discharge electrode and the coefficient of thermal expansion of the insulating substrate. Thus, differences in the coefficient of thermal expansion between the facing portions of the discharge electrodes and the insulating substrate can be reduced by the mixed portion, and defects caused by separation or delamination of the discharge electrodes or deterioration of the characteristics can be reduced.

The mixed portion including metal materials is preferably arranged adjacent to the facing portions of the discharge electrodes in which discharge occurs. Thus, by adjusting the amount, type, or other characteristics of the metal materials included in the mixed portion, the firing potential can be set to a desired value. Thus, the firing potential can be set with high accuracy rather than the case in which the firing potential is adjusted by varying the interval between the facing portions of the discharge electrodes.

Preferably, the mixed portion is arranged adjacent to only the facing portions and the space between the facing portions.

In this case, since the mixed portion including metal materials is not arranged at peripheral regions other than the region adjacent to the facing portions and the space between the facing portions of the discharge electrodes, the electrical characteristics, such as a dielectric constant, and the mechanical strength of the insulating substrate of the peripheral regions are not deteriorated due to the metal materials of the mixed portion.

Preferably, when viewed in the direction in which the facing portions of the discharge electrodes and the mixed portion are overlapped with each other, the mixed portion is arranged in contact with the periphery of the cavity and only inside the periphery.

In this case, since the mixed portion is arranged only directly under the cavity, variations in the interval between the facing portions of the discharge electrodes is small, and the firing potential can be adjusted with increased accuracy.

Preferably, the insulating substrate is a ceramic substrate, for example.

It is relatively easy to form a cavity, a circuit element, and/or a wiring pattern in the ceramic substrate by laminating two or more base material layers and firing the laminate. Thus, a ceramic substrate is suitable for an insulating substrate of a substrate including an ESD protection function.

Preferably, the cavity and the discharge electrode are arranged near a signal input portion of the insulating substrate.

In this case, by reducing the wiring distance from the signal input portion of the insulating substrate to the ESD protection portion as much as possible, a reduction in the ESD protection performance due to the influence of wiring impedance is prevented. For example, when the ESD protection portion is disposed between the signal input portion of the insulating substrate and a circuit element provided in the insulating substrate or an electronic component mounted on the insulating substrate, the ESD protection performance can be sufficiently provided to the circuit element included in the insulating substrate or the electronic component mounted on the insulating substrate.

Preferably, the circuit element or the wiring pattern defines a high frequency circuit.

Compared to a case in which a varistor or a Zener diode is used for ESD protection, according to preferred embodiments of the present invention, the capacity of the ESD protection portion can be set to be very small, and thus, can sufficiently provide the ESD protection function to a high frequency circuit. For example, the ESD protection function can be sufficiently provided to a high frequency circuit of about 300 MHz to several GHz.

Preferably, an IC is mounted on the insulating substrate or in the insulating substrate.

In this case, the mounted IC operates even at a high frequency because the capacity of the ESD protection is small. Compared to a case in which a separate and independent ESD protection device is used, a degradation of the protection function due to the wiring impedance between the ESD protection portion and the IC is reduced by reducing the distance therebetween.

The substrate including an ESD protection function according to preferred embodiments of the present invention can reduce the size of a circuit and sufficiently provide an ESD protection function.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to FIGS. 1 to 17.

First Preferred Embodiment

A substrate 10 including an ESD protection function according to a first preferred embodiment of the present invention will be described with reference to FIGS. 1 to 4.

Figure 1:
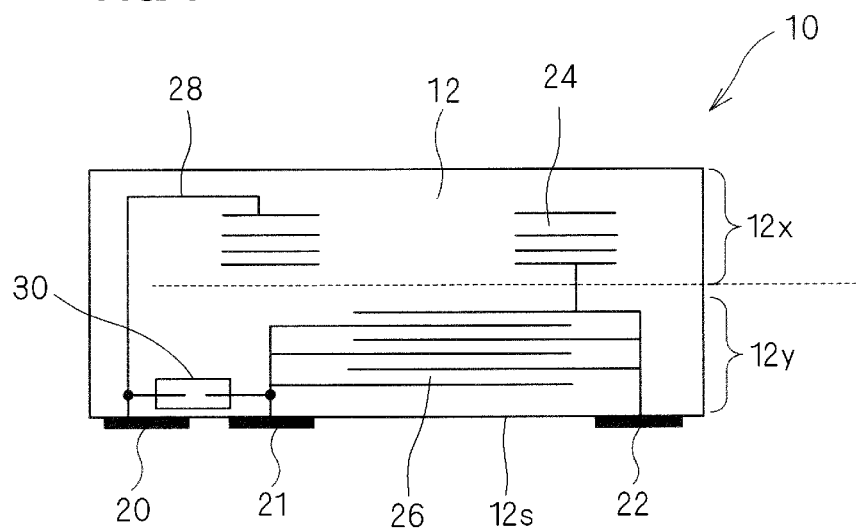
FIG. 1 is an outline view illustrating a substrate including an ESD protection function according to a preferred embodiment of the present invention.
Figure 2:
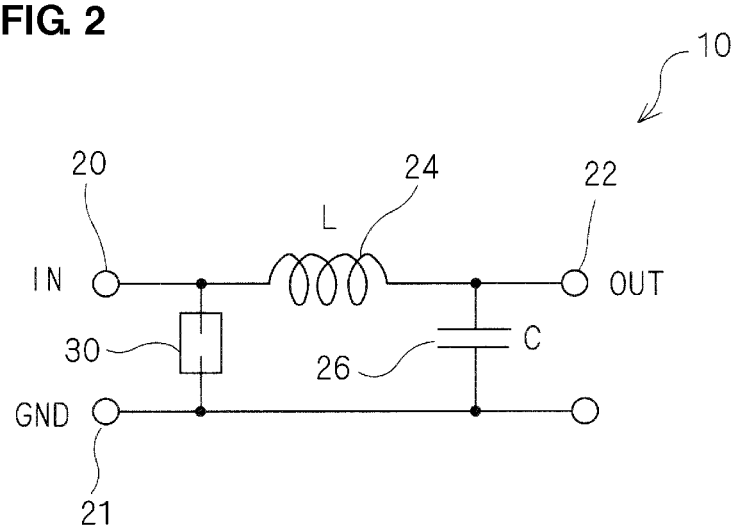
FIG. 2 is an electric circuit diagram illustrating the circuit structure of the substrate including an ESD protection function shown in FIG. 1.

First, the overall structure of the substrate 10 including an ESD protection function according to the first preferred embodiment will be described with reference to FIGS. 1 and 2. FIG. 1 is an outline view schematically illustrating the substrate 10 including an ESD protection function. FIG. 2 is an electric circuit diagram illustrating the circuit structure of the substrate 10 including an ESD protection function.

As illustrated in FIGS. 1 and 2, the substrate 10 including an ESD protection function preferably includes a ceramic multilayer substrate 12 obtained by laminating two or more base material layers in which an inductor element 24 and a capacitor element 26, a wiring pattern 28, and an ESD protection portion 30 are provided. On a lower surface 12s of the ceramic multilayer substrate 12, external electrodes 20, 21, and 22 are provided and arranged to be used to mount the substrate 10 including an ESD protection function on another circuit substrate.

The inductor element 24 is arranged in an upper portion 12x of the ceramic multilayer substrate 12 and the capacitor element 26 is arranged in a lower portion 12y of the ceramic multilayer substrate 12. The inductor element 24 and the capacitor element 26 define a low pass filter. More specifically, the substrate 10 including an ESD protection function is a low pass filter including an ESD protection function.

The wiring pattern 28 electrically connects the inductor element 24, the capacitor element 26, the ESD protection portion 30, and the external electrodes 20, 21, and 22.

Instead of the ceramic multilayer substrate 12, insulating substrates other than the ceramic multilayer substrate, such as a ceramic substrate including a single base material layer or a substrate including materials other than ceramic, such as a resin substrate, may be used, for example. However, as described later, when the ceramic multilayer substrate is used, various kinds of the substrate including an ESD protection function can be easily produced. Thus, the use of the ceramic multilayer substrate is preferable.

The external electrodes 20 and 21 and the ESD protection portion 30 are individually arranged on each of both sides of a single base material layer so as to substantially face each other. More specifically, the ESD protection portion 30 is preferably arranged near the external electrode 20 defining an input terminal. Thus, an ESD voltage entering the substrate 10 including an ESD protection function can be blocked at the entrance.

The ESD protection portion 30 is preferably connected between the external electrode 21 defining an input terminal and the external electrode 20 defining a ground terminal. The low pass filter defined by the inductor element 24 and the capacitor element 26 is connected to a latter stage of the ESD protection portion 30, i.e., the external electrode 22 side defining an output terminal.

Figure 3:
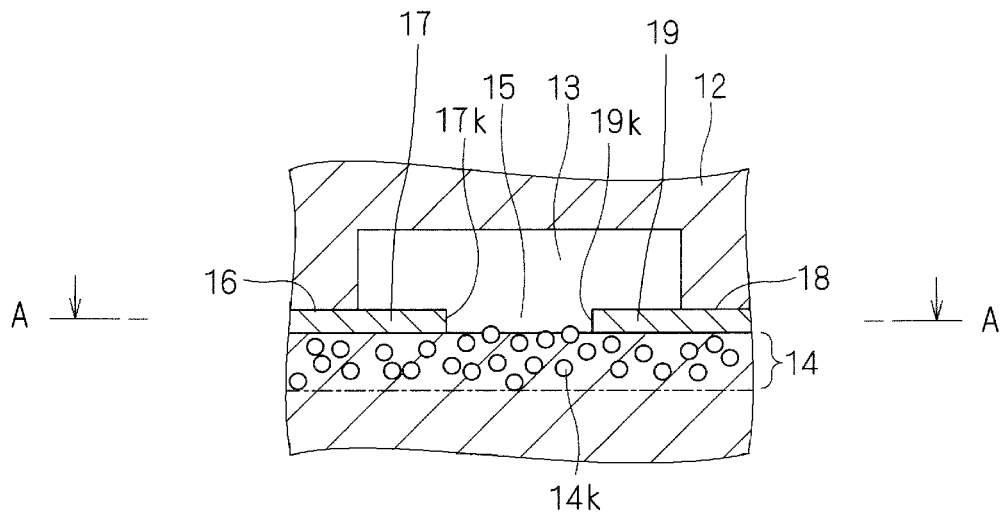
FIG. 3 is a cross sectional view illustrating an ESD protection portion of the substrate according to a preferred embodiment of the present invention.
Figure 4:
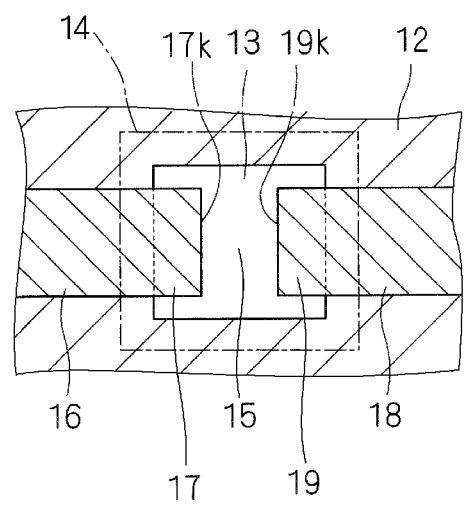
FIG. 4 is a cross sectional view along the A-A line of FIG. 3.

Next, the structure of the ESD protection portion 30 will be described with reference to FIGS. 3 and 4. FIG. 3 is a cross section of the ESD protection portion 30. FIG. 4 is a cross sectional view along the A-A line of FIG. 3.

As schematically illustrated in FIGS. 3 and 4, in the ESD protection portion 30, facing portions 17 and 19 of discharge electrodes 16 and 18 are disposed in a cavity 13 provided in the ceramic multilayer substrate 12. More specifically, portions disposed in the cavity 13 of the discharge electrodes 16 and 18 define the facing portions 17 and 19. Ends 17k and 19k of the facing portions 17 and 19 of the discharge electrodes 16 and 18 face each other with a space 15 therebetween.

As illustrated in FIGS. 1 and 2, the discharge electrodes 16 and 18 are electrically connected to the external electrodes 20 and 21, respectively, through the wiring pattern 28. When a voltage equal to or greater than a given value is applied between the external electrodes 20 and 21, discharge occurs between the facing portions 17 and 19 of the discharge electrodes 16 and 18.

As illustrated in FIG. 3, a mixed portion 14 is arranged adjacent to the facing portions 17 and 19 of the discharge electrodes 16 and 18 and a portion 15 therebetween. The mixed portion 14 is arranged in contact with the facing portions 17 and 19 of the discharge electrodes 16 and 18 and a base material layer of the ceramic multilayer substrate 12. The mixed portion 14 preferably includes particular metal materials 14k dispersed in a ceramic base material, for example.

As illustrated in FIG. 4, the mixed portion 14 may preferably be configured to be larger than the cavity 13. Alternatively, although not illustrated, the mixed portion 14 may be smaller than the cavity 13. For example, the mixed portion 14 may be arranged only in a portion of a region adjacent to the cavity.

The mixed portion 14 may preferably be arranged adjacent to at least the facing portions 17 and 19 of the discharge electrodes 16 and 18 and adjacent to a continuous portion between the facing portions 17 and 19. More specifically, the mixed portion 14 may preferably be arranged so as to connect the facing portions 17 and 19 of the discharge electrodes 16 and 18, for example.

The ceramic material in the base material of the mixed portion 14 may be the same as or different from the ceramic material of the base material layer of the ceramic multilayer substrate 12. When the same material is used, the shrinkage characteristics can easily be made the same or substantially the same as that of the ceramic multilayer substrate 12 and the types of materials used for the substrate can be reduced. The metal materials 14k included in the mixed portion 14 may be the same as or different from that of the discharge electrodes 16 and 18. When the same material is used, the shrinkage characteristics can easily be made the same as that of the discharge electrodes 16 and 18 and the types of materials used for the substrate can be reduced.

Since the mixed portion 14 includes the metal materials 14k and a ceramic material, the shrinkage characteristics of the mixed portion 14 during firing are set to an intermediate state between that of the discharge electrodes 16 and 18 including the facing portions 17 and 19 and that of the base material layer of the ceramic multilayer substrate 12. Thus, the differences in the shrinkage characteristics during firing between the facing portions 17 and 19 of the discharge electrodes 16 and 18 and the base material layer of the ceramic multilayer substrate 12 can be reduced by the mixed portion 14. As a result, defects caused by the separation or delamination of the facing portions 17 and 19 of the discharge electrodes 16 and 18 or a variation in the characteristics can be minimized and prevented. Moreover, since a variation in the space 15 between the facing portions 17 and 19 of the discharge electrodes 16 and 18 is also reduced, a variation in the characteristics, such as a firing potential, can be minimized and prevented.

The coefficient of thermal expansion of the mixed portion 14 can be set to an intermediate value between that of the discharge electrodes 16 and 18 and that of the base material layer of the ceramic multilayer substrate 12. Thus, differences in the coefficient of thermal expansion of the facing portions 17 and 19 of the discharge electrodes 16 and 18 and the base material layer of the ceramic multilayer substrate 12 can be reduced by the mixed portion 14. As a result, defects caused by the separation or delamination of the facing portions 17 and 19 of the discharge electrodes 16 and 18 or deterioration of the characteristics can be reduced.

By adjusting the amount, type, or other factors of the metal materials 14k included in the mixed portion 14, the firing potential can be set to a desired value. Thus, the firing potential can be set with a greater accuracy than when the firing potential is adjusted only by the space 15 between the facing portions 17 and 19 of the discharge electrodes 16 and 18.

Next, a non-limited example for producing the substrate 10 including an ESD protection function will be described.

For the ceramic materials, materials having a composition primarily including Ba, Al, and Si were used. Each material was blended and mixed so as to achieve a given composition, and the mixture was preferably calcined at about 800° C. to about 1000° C. The obtained calcined powder was ground in a zirconia ball mill for about 12 hours, thereby obtaining ceramic powder. To the ceramic powder, organic solvents, such as toluene•EKINEN, for example, were added and mixed. Furthermore, a binder and a plasticizer were added, and mixed, thereby obtaining a slurry. The slurry was then molded by a doctor blade method, for example, thereby obtaining a ceramic green sheet having a thickness of about 50 μm.

An electrode paste was produced as follows. A solvent was added to a binder resin preferably including about 80 wt % of Cu powder having an average particle diameter of about 2 μm, ethyl cellulose, or other suitable material, and stirred and mixed by three rolls, thereby obtaining an electrode paste.

Further, Cu powder and the ceramic powder after the ceramic material was calcined were blended at a given ratio, and a binder resin and a solvent were similarly added, thereby obtaining a mixed paste of ceramic and metal. In the mixed paste, the resin and the solvent preferably composed about 20 wt % and the ceramic and the Cu powder preferably composed about 80 wt %, for example. As shown in Table I, mixed pastes having different ceramic/Cu powder volume ratio were prepared.

TABLE 1

| Paste No. | Volume ratio (vol %) | |
| --- | --- | --- |
|  | Ceramic powder | Cu powder |
| 1 | 100 | 0 |
| 2 | 95 | 5 |
| 3 | 90 | 10 |
| 4 | 80 | 20 |
| 5 | 70 | 30 |
| 6 | 50 | 50 |
| 7 | 40 | 60 |
| 8 | 0 | 100 |

Resin pastes including only resin and a solvent were produced by the same method. For resin materials, resin that decomposes and disappears during firing was used. For example, PET, polypropylene, ethylcellulose, acrylic resin, or other suitable resin pastes may be used.

In order to form the mixed portion 14 on a ceramic green sheet, the ceramic/metal mixed paste was preferably applied with a thickness of about 2 μm to about 100 μm by screen printing so as to have a desired pattern. When the thickness of the ceramic/metal mixed paste is relatively large, a concave portion prepared beforehand in the ceramic green sheet may be filled with the ceramic/metal mixed paste.

The electrode paste is applied onto the ceramic green sheet to form the discharge electrodes 16 and 18 having a discharge gap between the facing portions 17 and 19. Here, the discharge electrodes 16 and 18 were formed so that the thickness of the discharge electrodes 16 and 18 was preferably set to about 100 μm and the discharge gap width (size of a gap between the facing portions 17 and 19) was preferably set to about 30 μm, for example. Further, the resin paste is applied thereto in order to form the cavity 13.

Portions other than a portion defining the ESD protection portion 30, i.e., portions defining the inductor element 24, the capacitor element 26, the wiring pattern 28, and the external electrodes 20, 21, and 22 were formed in the same or substantially the same manner as a conventional ceramic multilayer substrate. For example, they were formed by forming a penetration hole in a ceramic green sheet by machining or laser beam machining, filling the penetration hole with an electrode paste, or applying an electrode paste onto a ceramic green sheet by screen printing.

Ceramic green sheets were laminated and pressure-bonded in the same or substantially the same manner as a conventional ceramic multilayer substrate. Here, the sheets were preferably laminated so that the total thickness is set to about 0.3 mm, for example.

The laminate was preferably cut into chips by a micro cutter in the same or substantially the same manner as in conventional chip type electronic components, such as an LC filter.

Subsequently, the laminate was preferably fired in an $N_2$ atmosphere in the same or substantially the same manner as in a conventional ceramic multilayer substrate. When a rare gas, such as Ar or Ne, is introduced into the cavity 13 in order to reduce a response voltage to the ESD, firing may be performed in a rare gas atmosphere, such as Ar or Ne, in a temperature range at which the shrinkage or sintering of ceramic materials is performed. In the case of electrode materials, e.g., Ag, which do not oxidize, the air atmosphere may preferably be used.

Ni—Sn electroplating, for example, was preferably performed on the external electrodes 20 and 21 and 22 in the same or substantially the same manner as in conventional chip type electronic components, such as an LC filter.

Thus, a non-limited example of the substrate 10 including an ESD protection function was produced which has a cross section as illustrated in FIGS. 1, 3, and 4.

The ceramic materials are not limited to the above-described materials as long as the materials are insulating materials. Thus, other materials, such as a substance obtained by adding glass to forsterite or a substance obtained by adding glass to $CaZrO_3$, for example, may be used. The electrode materials are not limited to Cu and Ag, Pd, Pt, Al, Ni, W, or a combination thereof, for example, may be used. The ceramic/metal mixed material is not limited to being formed as a paste and may be formed into a sheet and disposed in the substrate, for example.

The resin paste was applied in order to form the cavity 13. However, other substances, such as carbon, for example, may be used as long as the substances disappear by firing. A resin film or other suitable material may be arranged so as to be adhered to a desired portion, instead of forming a paste and printing the same.

100 samples of the substrate 10 including an ESD protection function according to the preferred embodiment described above were produced and evaluated by observing the internal cross section, for short-circuiting, disconnection after firing, and the occurrence of delamination between the discharge electrodes 16 and 18.

Further, the shrinkage start temperatures of the pastes were compared. Specifically, in order to analyze the shrinkage behavior of each paste substance, the paste was dried, the powder thereof was pressed, a pressure-bonded body having a height of about 3 mm was produced, and then the measurement was performed by TMA (Thermomechanical analysis). The shrinkage start temperature of ceramic was about 885° C. for a paste No. 1.

The discharge responsiveness to the ESD was evaluated. The evaluation of the discharge responsiveness to the ESD was performed by an electrostatic discharge immunity test specified in IEC Standards, IEC61000-4-2. It was analyzed whether discharge occurs between the discharge electrodes of samples by applying about 8 kV by contact discharge. Table 2 below shows ceramic/metal mixed paste ratios and evaluation results.

TABLE 2

| Sample No. | Volume ratio (vol %) | | Paste shrinkage Start temperature (° C.) | Short rate (%) | Disconnection rate (%) | Delamination Occurrence | ESD discharge Responsiveness |
|---|---|---|---|---|---|---|---|
| | Ceramic powder | Cu powder | | | | | |
| 1* | 100 | 0 | 885 | 10 | 6 | Occur | ◯ |
| 2 | 95 | 5 | 880 | 4 | 1 | None | ◯ |
| 3 | 90 | 10 | 840 | 0 | 0 | None | ◯ |
| 4 | 80 | 20 | 820 | 0 | 0 | None | ◯ |
| 5 | 70 | 30 | 810 | 0 | 0 | None | ◯ |
| 6 | 50 | 50 | 780 | 0 | 0 | None | ◯ |
| 7 | 40 | 60 | 745 | 25 | 0 | None | — |
| 8* | 0 | 100 | 680 | 100 | 5 | Occur | — |

In Table 2, the samples marked with * are samples that are outside of the range of preferred embodiments of the present invention.

More specifically, when the proportion of metals in the ceramic/metal mixed paste is less than about 5 vol % (paste No. 1), the start of shrinkage of the paste is not significantly different from that of ceramic and the difference is about 200° C. as compared to about 680° C. which is the shrinkage start temperature of an electrode (paste No. 8). Therefore, short-circuiting and disconnection occur in the sample after firing. Moreover, delamination and separation of the discharge electrodes were also observed.

When the proportion of metals in the ceramic/metal mixed paste is about 10 vol % or greater, the shrinkage start temperature of the pastes is close to the shrinkage start temperature of the electrode and is about an intermediate temperature between that of the electrode and that of the ceramic. In this case, short-circuiting, disconnection, electrode separation, and delamination were not observed in the samples. The discharge responsiveness to the ESD does not substantially deteriorate due to the ceramic/metal mixed paste and is, thus, preferable. Moreover, a variation in the gap width between the discharge electrodes was also small.

When the proportion of metals in the ceramic/metal mixed paste is about 60 vol % or greater, short-circuiting between the discharge electrodes occurs after firing due to contact between metal particles in the mixed paste. Thus, such a proportion is not preferable.

By adjusting the metal proportion in the mixed materials in the range of about 10 vol % to about 50 vol %, for example, as in sample No. 3 to 6, the above-described defects do not occur. In particular, the metal proportion is more preferably in the range of about 30 vol % to about 50 vol %, for example. More specifically, the content of the metal materials 14k in the mixed portion 14 is preferably in the range of about 10 vol % to about 50 vol %, for example, and more preferably in the range of about 30 vol % to about 50 vol %.

As described above, the material having an intermediate shrinkage behavior between that of the ceramic material and that of the electrode material is obtained by mixing electrode materials and ceramic materials. By arranging the material between the electrodes and ceramic and a discharge gap portion to provide a mixed portion, stress to be applied between the discharge electrodes and the ceramic multilayer substrate can be reduced and disconnection of the discharge electrodes or delamination of the discharge electrode portion, short-circuiting caused by electrode separation or a variation in the discharge gap width due to a variation in the shrinkage variation of the electrodes in the cavity are prevented from occurring.

In the substrate 10 including an ESD protection function of the first preferred embodiment, since the external electrode 21 defining an input terminal and the external electrode 20 defining a ground terminal are directly connected to each other through the ESD protection portion 30, an ESD signal entering from the external electrode 20 defining an input terminal is efficiently by-passed to the ground through the ESD protection portion 30. More specifically, the substrate 10 including an ESD protection function provide the ESD protection function to the low pass filter provided in a latter stage of the ESD protection portion 30.

The low pass filter is preferably used to protect against EMI (electromagnetic interference) for a signal transmission line of both surfaces of a monitor, for example. For such a purpose, a possibility that ESD is applied from the outside is relatively high, and a problem of IC breakage can be prevented by providing an ESD protection function.

In the substrate 10 including an ESD protection function, by including the low pass filter and the ESD protection portion 30, the mounting area can be reduced as compared to a case in which a low pass filter and an ESD protection device are separately provided. In the substrate 10 including an ESD protection function, the low pass filter and the ESD protection device are also manufactured by a ceramic sheet lamination method, which results in only a small increase in the cost due to the incorporation of the ESD protection function in the ESD low pass filter.

The substrate 10 including an ESD protection function can efficiently control an ESD voltage by providing the ESD protection function at a preliminary stage of the low pass filter. Since the capacity between terminals of the ESD protection portion 30 is relatively small, a problem of signal transmission impedance mismatching is negligible.

Second Preferred Embodiment

Figure 5:
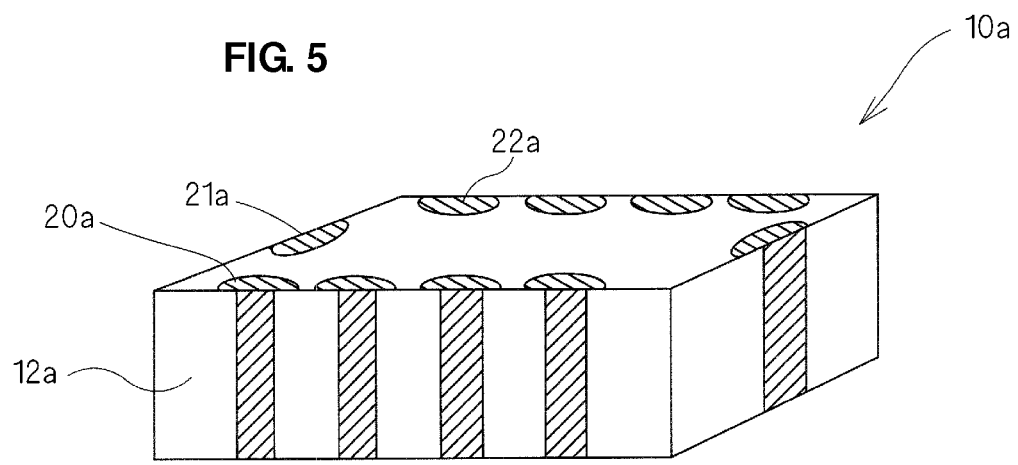
FIG. 5 is a perspective view of a substrate including an ESD protection function according to another preferred embodiment of the present invention.
Figure 6:
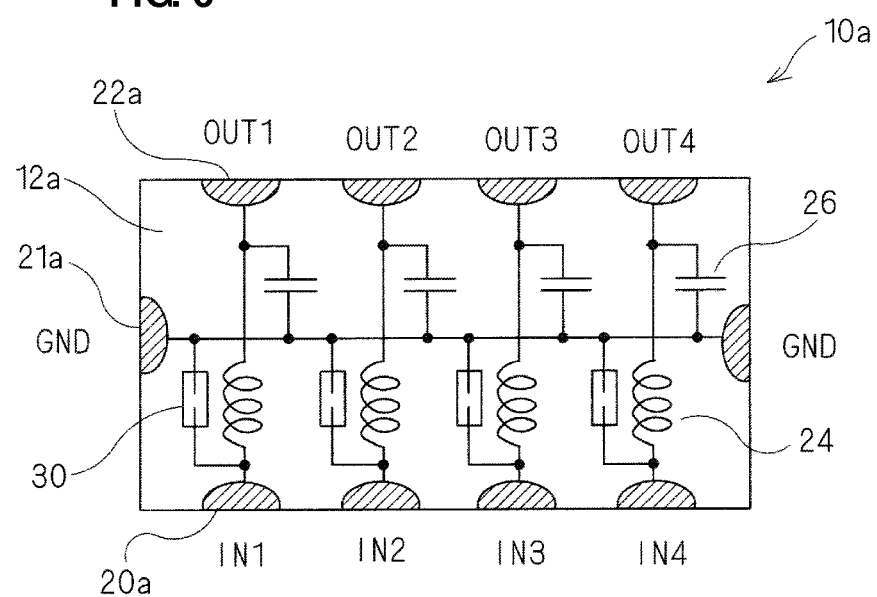
FIG. 6 is an electric circuit diagram illustrating the circuit structure of the substrate including an ESD protection function shown in FIG. 5.

A substrate 10a including an ESD protection function according to a second preferred embodiment of the present invention will be described with reference to FIGS. 5 and 6. FIG. 5 is a perspective view illustrating the substrate 10a including an ESD protection function. FIG. 6 is an electric circuit diagram illustrating the circuit structure of the substrate 10a including an ESD protection function.

The substrate 10a including an ESD protection function according to the second preferred embodiment is substantially the same as the substrate 10 including an ESD protection function of the first preferred embodiment. Hereinafter, the differences between the second preferred embodiment and the first preferred embodiment will be described and the same components as those of the first preferred embodiment are designated by the same reference symbols.

As illustrated in FIG. 5, in the substrate 10a including an ESD protection function of the second preferred embodiment, four sets of external electrodes 20a and 22a defining input terminals and output terminals and two external electrodes 21a defining ground terminals are provided on the surface of a cubic ceramic multilayer substrate 12a.

As illustrated in FIG. 6, in the ceramic multilayer substrate 12a, the inductor element 24 and the capacitor element 26 defining a low pass filter and the ESD protection portion 30 are connected to each of the four sets of the external electrodes 20a and 22a similar to the first preferred embodiment. More specifically, the substrate 10a including an ESD protection function of the second preferred embodiment is a four-pole low pass filter with an ESD protection function.

The low pass filter, the ESD protection portion 30, and the wiring pattern in the ceramic multilayer substrate 12a can be similar to those in the first preferred embodiment and can be manufactured by the same or substantially the same method as in the first preferred embodiment.

In the substrate 10a including an ESD protection function of the second preferred embodiment, two or more low pass filters are included in one chip. Thus, when two or more signal lines are disposed in parallel as in a monitor image data transmission line, a component mounting area can be reduced.

Third Preferred Embodiment

Figure 7:
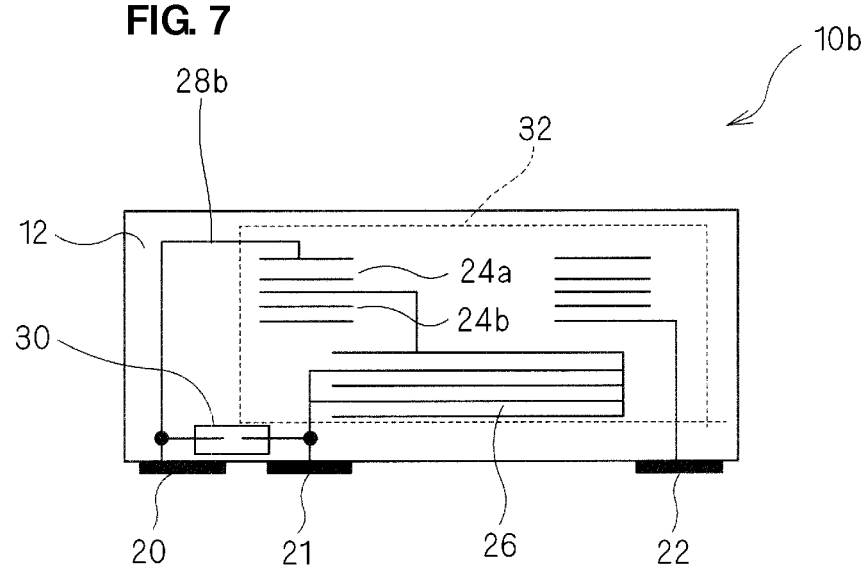
FIG. 7 is an outline view illustrating the structure of a substrate including an ESD protection function according to another preferred embodiment of the present invention.
Figure 8:
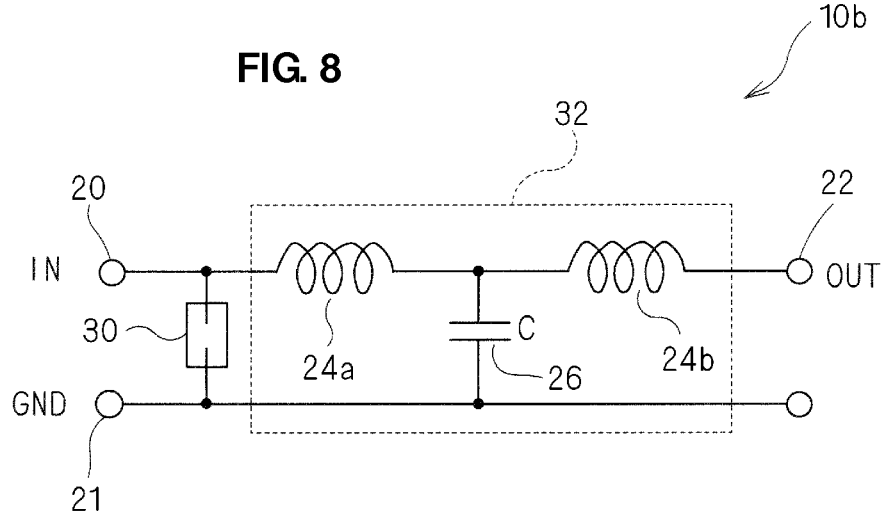
FIG. 8 is an electric circuit diagram illustrating the circuit structure of the substrate including an ESD protection function shown in FIG. 7.

A substrate 10b including an ESD protection function according to a third preferred embodiment of the present invention will be described with reference to FIGS. 7 and 8. FIG. 7 is an outline view schematically illustrating the cross-sectional structure of the substrate 10b including an ESD protection function. FIG. 8 is an electric circuit diagram illustrating the circuit structure of the substrate 10b including an ESD protection function.

In the substrate 10b including an ESD protection function of the third preferred embodiment, the inductor elements 24a and 24b, the capacitor element 26, a wiring pattern 28b, and the ESD protection portion 30 are provided in the ceramic multilayer substrate 12 in a similar manner as in the substrate 10 including an ESD protection function of the first preferred embodiment. However, unlike the first preferred embodiment, the capacitor element 26 is connected to the connecting point of the two inductor elements 24a and 24b, and the inductor elements 24a and 24b and the capacitor element 26 define a phase shifter 32.

The ESD protection portion 30 is connected to a preliminary stage of the phase shifter 32. More specifically, the external electrode 20 defining an input terminal and the external electrode 21 defining a ground terminal are directly connected to each other through the ESD protection portion 30. Therefore, an ESD signal entering from the external electrode 20 defining an input terminal is efficiently by-passed to the external electrode defining a ground terminal through the ESD protection portion 30.

FIGS. 7 and 8 illustrate a three dimensional LC filter as the phase shifter 32, which is only one example. In actual use, a filter order or the structure may be changed according to a required phase shift amount.

The phase shifter is preferably used for an antenna end of a cellular phone, for example, and improves the efficiency of electric wave radiation from the antenna by shifting the phase of a high frequency signal to be input and output to/from the antenna. The antenna is likely to be exposed to ESD from the outside and is difficult to protect from ESD because a signal to be treated has a high frequency. Furthermore, in order to increase the radiant efficiency from the antenna, impedance matching is very important for the phase shifter, and thus, a typical ESD protection device cannot be used therefor.

In contrast, the ESD protection portion 30 of the substrate 10b including an ESD protection function of the third preferred embodiment preferably has a relatively low capacity and a relatively high impedance, and thus, can also be used with the phase shifter 32.

Fourth Preferred Embodiment

Figure 9:
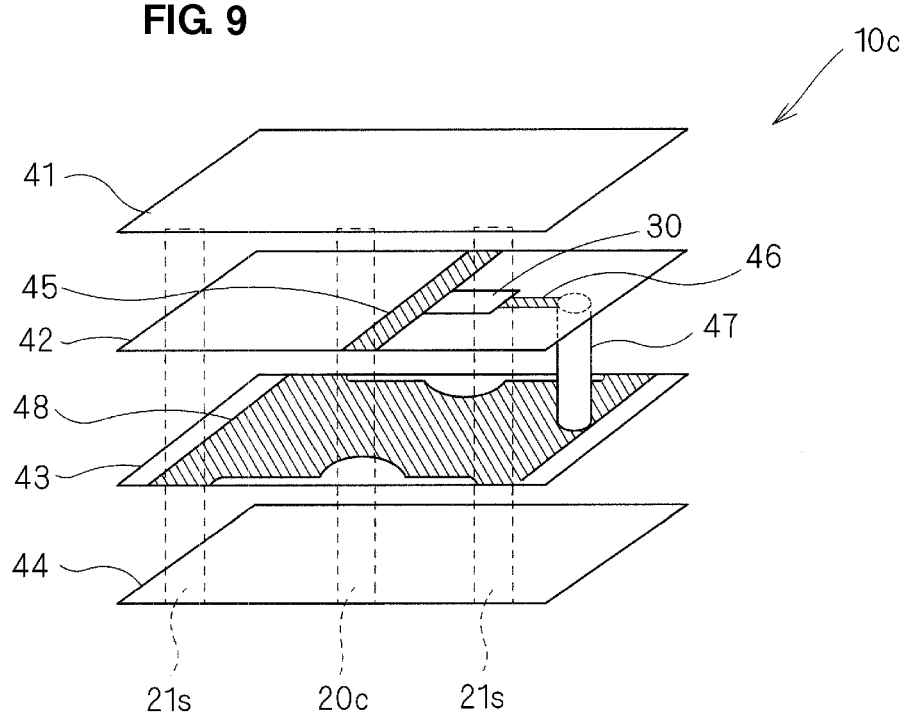
FIG. 9 is an exploded perspective view illustrating a substrate including an ESD protection function according to another preferred embodiment of the present invention.
Figure 10:
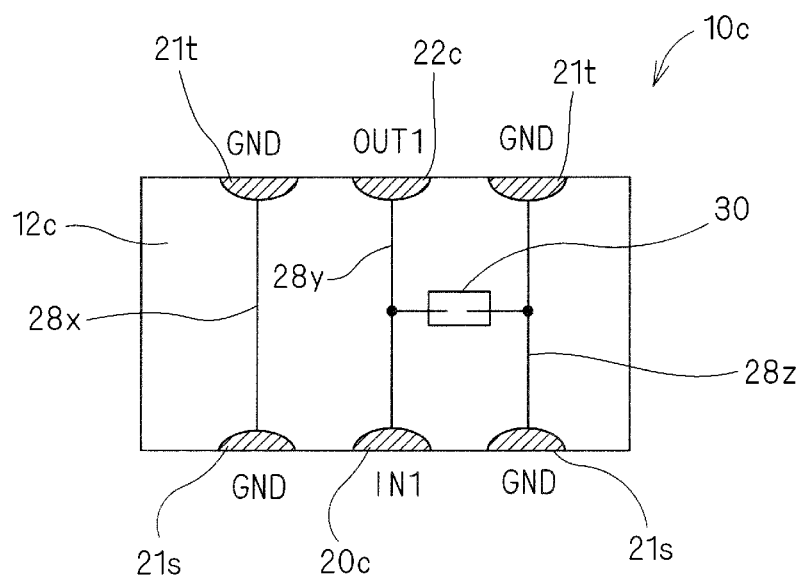
FIG. 10 is an electric circuit diagram illustrating the circuit structure of the substrate including an ESD protection function shown in FIG. 9.

A substrate 10c including an ESD protection function according to a fourth preferred embodiment of the present invention will be described with reference to FIGS. 9 and 10. FIG. 9 is a perspective view schematically illustrating the substrate 10c including an ESD protection function. FIG. 10 is an electric circuit diagram illustrating the circuit structure of the substrate 10c including an ESD protection function.

As illustrated in FIGS. 9 and 10, in the substrate 10c including an ESD protection function of the fourth preferred embodiment, a second base material layer 42 of a ceramic multilayer substrate preferably includes an internal signal line 45 defined by a wiring pattern and the ESD protection portion 30. On substantially the entire surface of a third base material layer 43 of the ceramic multilayer substrate, a ground electrode 48 is provided to define a wiring pattern. A radiation electrode 46 at one side of the ESD protection portion 30 of the second base material layer 42 and the ground electrode 48 of the third base material layer 43 are connected to each other by a via-conductor 47.

On one side surface (front side surface in FIG. 9) of each of a first base material layer 41 to a fourth base material layer 44 of the ceramic multilayer substrate, two external electrodes 21s defining ground terminals and one external electrode 20c to which a signal is input are provided. Although not illustrated in FIG. 9, on the other side surface (back side surface in FIG. 9) of each of the first base material layer 41 to the fourth base material layer 44 of the ceramic multilayer substrate, two external electrodes 21t defining ground terminals and one external electrode 22c from which a signal is output are provided. The ground electrode 48 provided on the third base material layer 43 is connected to the external electrodes 21s and 21t defining ground terminals but is not connected to the external electrodes 20c and 22c to and from which a signal is input and output.

More specifically, the internal signal line 45 of the second base material layer 42 defines a signal line 28y between the external electrodes 20c and 22c defining an input terminal and an output terminal, respectively. The ground electrode of the third base material layer 43 defines strip lines 28x and 28z between the external electrodes 21s and 21t defining ground terminals. The ESD protection portion 30 is arranged between the signal line 28y and the strip line 28z. The line impedance can be designed to be a desired value.

When an ESD protection element is used for the signal transmission line, it is preferably connected by a signal line in the ESD protection element by cutting a signal line on a printed circuit board. This is because such a structure produces an advantage of increasing the degree of design freedom of the printed circuit board. However, in the ESD protection element portion, a discontinuous point of line impedance (usually set to about 50Ω to about 300Ω on a printed circuit board) arises, and thus, the signal transmission quality is deteriorated.

In contrast, since the strip line is provided in the ceramic multilayer substrate in the substrate 10C including an ESD protection function of the fourth preferred embodiment and the line impedance can be matched with the impedance of a printed circuit board, the degradation of signal transmission quality is effectively prevented.

Fifth Preferred Embodiment

Figure 11:
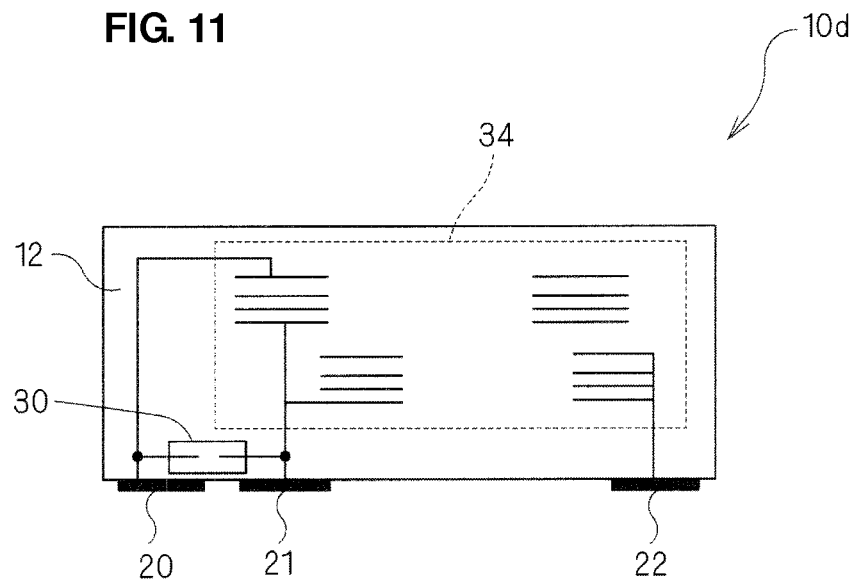
FIG. 11 is a schematic diagram illustrating a substrate including an ESD protection function according to another preferred embodiment of the present invention.
Figure 12:
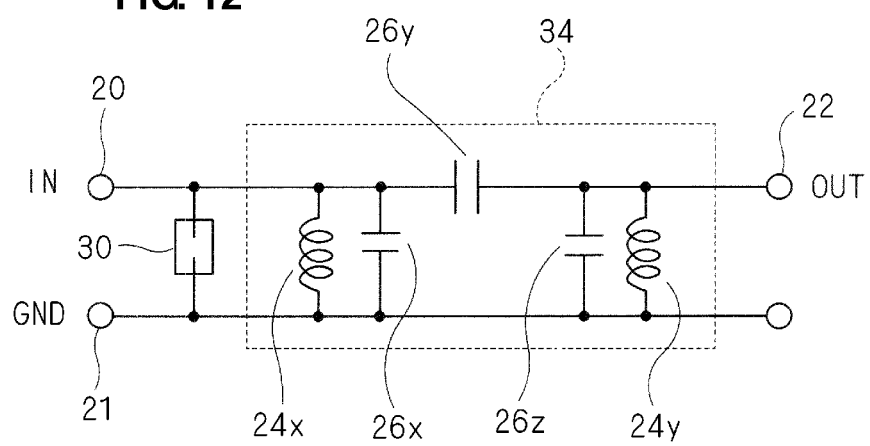
FIG. 12 is an electric circuit diagram illustrating the circuit structure of the substrate including an ESD protection function shown in FIG. 11.

A substrate 10d including an ESD protection function according to a fifth preferred embodiment of the present invention will be described with reference to FIGS. 11 and 12. FIG. 11 is an outline view schematically illustrating the cross-sectional structure of the substrate 10d including an ESD protection function. FIG. 12 is an electric circuit diagram illustrating the circuit structure of the substrate 10d including an ESD protection function.

As illustrated in FIGS. 11 and 12, the substrate 10d including an ESD protection function of the fifth preferred embodiment includes a resonant circuit 34 and the ESD protection portion 30 in the ceramic multilayer substrate 12.

The ESD protection portion is connected between the external electrode 21 defining an input terminal and the external electrode 20 defining a ground terminal. The resonant circuit 34 is connected to a latter stage of the ESD protection portion 30, i.e., to the external electrode 22 side defining an output terminal.

FIGS. 11 and 12 illustrate a bandpass filter including inductor elements 24x and 24y and capacitor elements 26x, 26y, and 26z as the resonant circuit 34. However, such a structure is only one example, and a resonant circuit including a strip line defined by electrode wiring may be used, for example.

The resonant circuit is used for the antenna end of short-distance communication using magnetic field combination, for example, and is used to extract, with a high sensitivity, a magnetic field signal to be input and output to and from an antenna. Such an antenna portion is likely to be exposed to ESD from the outside, and is difficult to protect from ESD because a signal to be treated has a high frequency.

The substrate 10d including an ESD protection function of the fifth preferred embodiment has an advantage in that since the ESD protection portion 30 has a low capacity and a high impedance, the Q of such a resonant circuit is not reduced.

Sixth Preferred Embodiment

Figure 13:
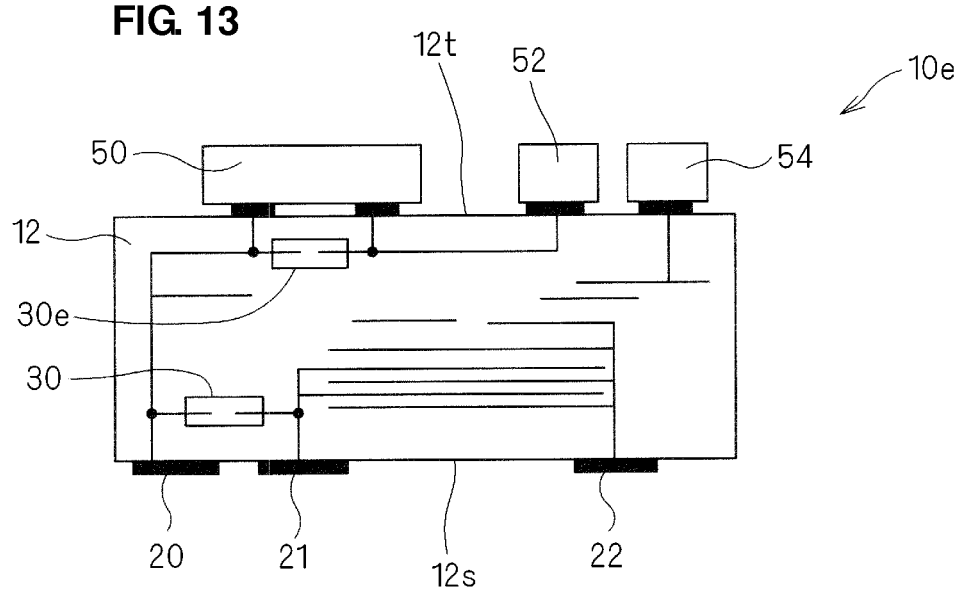
FIG. 13 is an outline view illustrating a substrate including an ESD protection function according to another preferred embodiment of the present invention.

A substrate 10e including an ESD protection function according to a sixth preferred embodiment of the present invention will be described with reference to FIG. 13. FIG. 13 is an outline view schematically illustrating the cross-sectional structure of the substrate 10e including an ESD protection function.

As illustrated in FIG. 13, the substrate 10e including an ESD protection function of the sixth preferred embodiment is a module component in which an IC 50 or mounting components 52 and 54 other than the IC are mounted on the upper surface 12t of the ceramic multilayer substrate 12. Similar to the first preferred embodiment, an inductor element, a capacitor element, a wiring pattern, the ESD protection portion 30, an ESD protection portion 30e are included in the ceramic multilayer substrate 12 and the external electrodes 20, 21, and 22 are provided on the lower surface 12s of the ceramic multilayer substrate.

FIG. 13 illustrates a case in which the components are mounted on only one side of the ceramic multilayer substrate 12. However, components may be mounted on both surfaces of the ceramic multilayer substrate 12, may be mounted in a concave portion provided in the ceramic multilayer substrate, or may be mounted on the side surface of the ceramic multilayer substrate.

Since the substrate 10e including an ESD protection function of the sixth preferred embodiment is a modular component having the ESD protection portions 30 and 30e in the ceramic multilayer substrate 12, the substrate 102 is advantageously less expensive to produce and occupies less space than the case in which the same function is provided by separate components.

The ESD protection portion 30e is preferably arranged on the side opposite to a base material layer defining the upper surface 12t of the ceramic multilayer substrate 12 and directly under the IC 50 to be mounted on the upper surface 12t of the ceramic multilayer substrate 12. Thus, by arranging the ESD protection portion 30e directly under the IC 50, the ESD protection performance to the IC 50 is improved.

The external electrodes 20 and 21 and the ESD protection portion 30 to be connected to the external electrodes 20 and 21 are preferably provided on both sides of a single base material layer of the ceramic multilayer substrate so as to substantially face each other. Thus, by arranging the ESD protection portion 30 near the external electrodes 20 and 21 defining module terminals, an ESD voltage entering the inside of the module can also be blocked at the module entrance.

Since the design flexibility of the substrate 10e including an ESD protection function of the sixth preferred embodiment is high, various requirements for ESD protection can be satisfied. In particular, since the volume of the ESD protection portion is relatively small, the ESD protection portion can be arranged on various portions in the module.

An ESD protection portion according to another preferred embodiment of the present invention will be described with reference to FIG. 14. The ESD protection portion of this preferred embodiment has substantially the same structure as the ESD protection portion 30 of the first preferred embodiment. The differences therebetween will be described and the same components are designated by the same reference symbols.

Figure 14:
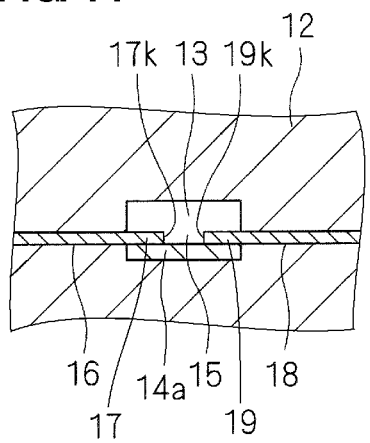
FIG. 14 is a cross sectional view illustrating an ESD protection portion according to a preferred embodiment of the present invention.

FIG. 14 illustrates the cross section of the ESD protection portion. As illustrated in FIG. 14, a mixed portion 14a is provided only directly under the cavity 13 in the ESD protection portion. More specifically, when viewed in a vertical direction in FIG. 14, the mixed portion 14a is preferably arranged in contact with the periphery of the cavity 13 and only inside the periphery of the cavity 13.

By arranging the mixed portion 14a only directly under the cavity 13 as described above, a variation in the shape of the cavity 13 is decreased. As a result, a variation in the space 15 between the facing portions 17 and 19 of the discharge electrodes 16 and 18 is decreased, and thus, the firing potential can be accurately set.

Figure 15:
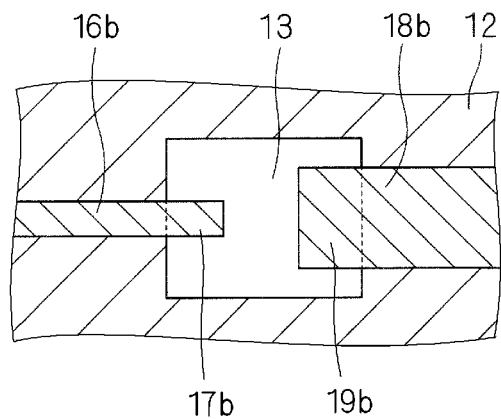
FIG. 15 is a cross sectional view illustrating an ESD protection portion according to another preferred embodiment of the present invention.

An ESD protection portion according to another preferred embodiment of the present invention will be described with reference to FIG. 15. FIG. 15 is a cross sectional view parallel or substantially parallel to discharge electrodes 16b and 18b similarly as in FIG. 4.

As illustrated in FIG. 15, the width of a facing portion 19b of one discharge electrode 18b disposed in the cavity 13 is preferably greater than the width of a facing portion 17b of the other discharge electrode 16b disposed in the cavity 13. The one discharge electrode 18b is connected to the ground side. The other discharge electrode 18b is connected to a circuit side to be protected from static electricity.

When the width of the facing portion 17b of the discharge electrode 16b to be connected to the circuit side is less than the width of the facing portion 19b of the discharge electrode 18b to be connected to the ground side, discharge from the circuit side to the ground side is more likely to occur. By increasing the electrode area of the discharge electrode 18b at the ground side, a connection resistance to the ground can be reduced and discharge from the circuit side to the ground side is more likely to occur. Therefore, the ESD protection portion of this preferred embodiment can prevent breakage of the circuit with increased reliability.

Figure 16:
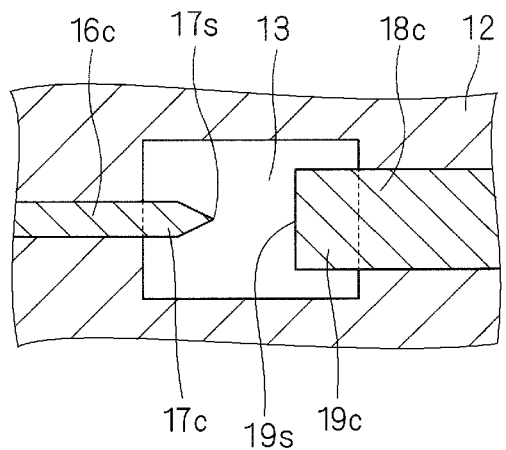
FIG. 16 is a cross sectional view illustrating an ESD protection portion according to another preferred embodiment of the present invention.

An ESD protection portion according to another preferred embodiment of the present invention will be described with reference to FIG. 16. FIG. 16 is a cross sectional view parallel to discharge electrodes 16c and 18c.

As illustrated in FIG. 16, an end 19s of a facing portion 19c of one discharge electrode 18c disposed in the cavity 13 is preferably substantially straight and flat and an end 17c of a facing portion 17c of the other discharge electrode 16c disposed in the cavity 13 is preferably substantially tapered and sharp. The one discharge electrode 18c is connected to the ground side. The other discharge electrode 16c is connected to a circuit (not illustrated) side to be protected from static electricity.

When the end 17s of the facing portion 17c of the discharge electrode 16c is substantially tapered and sharp, discharge is more likely to occur. Therefore, the ESD protection portion of this preferred embodiment can prevent breakage of the circuit with increased reliability.

Figure 17:
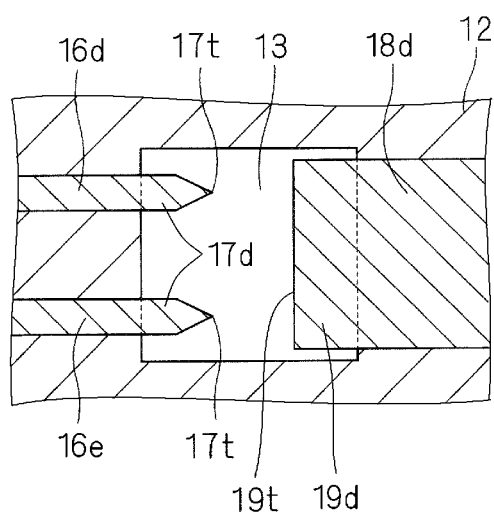
FIG. 17 is a cross sectional view illustrating an ESD protection portion according to another preferred embodiment of the present invention.
Figure 18:
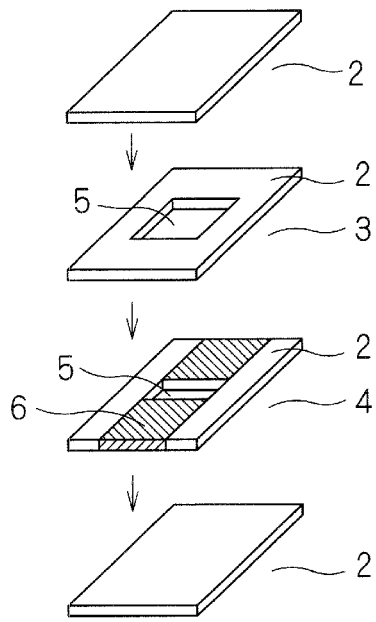
FIG. 18 is an exploded perspective view of an ESD protection device according to the related art.
Figure 19:
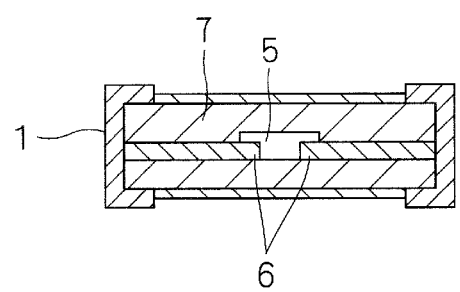
FIG. 19 is a cross sectional view of the ESD protection device shown in FIG. 18.

An ESD protection portion according to another preferred embodiment of the present invention will be described with reference to FIG. 17. FIG. 17 is a cross sectional view parallel or substantially parallel to discharge electrodes 16d, 16e, and 18d.

As illustrated in FIG. 17, two discharge electrodes 16d and 16e and one discharge electrode 18d define a pair and facing portions 17d of the two discharge electrodes 16d and 16e and a facing portion 19d of the one discharge electrode 18d are disposed in the cavity 13. An end 19t of the facing portion 19d of the one discharge electrode 18d is preferably substantially straight and flat but the ends 17t of the facing portions 17d of the other discharge electrodes 16d and 16e are preferably substantially tapered and sharp. The one discharge electrode 18d is connected to the ground side. The other discharge electrodes 16d and 16e are connected to a circuit side to be protected from static electricity.

When the ends 17t of the facing portions 17d of the discharge electrodes 16d and 16e at the circuit side are substantially tapered and sharp, discharge is more likely to occur. Therefore, the ESD protection portion of the modification 4 can prevent breakage of the circuit with increased reliability.

In the ESD protection portion of the modification 4, discharge separately occurs between the discharge electrode 18d and the one discharge electrode 16d and between the discharge electrode 18d and the other discharge electrode 16e, and thus, the discharge electrodes 16d and 16e can be individually connected to different circuits. In this case, the number of the ESD protection devices in an electronic device can be reduced and the size of the circuit in the electronic device can also be reduced.

For the ceramic multilayer substrate including the ESD protection portion, a non-shrinkage substrate is preferably used in which shrinkage suppression layers and base material layers are alternately laminated.

The base material layer is obtained by sintering one or two or more ceramic green sheets including a first ceramic material and governs the substrate characteristics of the ceramic multilayer substrate. A constraining layer includes one or two or more ceramic green sheets including a second ceramic material.

The thickness of each base material layer is preferably about 8 μm to about 100 μm, for example, after firing. The thickness after firing of each base material layer is not always limited to the range mentioned above and is preferably set to be substantially equal to or less than the maximum thickness with which each material layer can be constrained by the constraining layer during firing. The thickness of each of the base material layers is not necessarily the same.

A substance including a portion (e.g., glass ingredients) penetrating the constraining layer during firing is preferably used as the first ceramic material. As the first ceramic material, LTCC (Low Temperature Co-Fired Ceramic) that can be fired at a relatively low temperature, e.g., about 1050° C. is preferably used in order to achieve simultaneous firing with a conductive pattern including low melting metals, such as silver or copper, for example. Specifically, glass ceramic in which alumina and borosilicate glass are mixed, Ba—Al—Si—O-based ceramic that generate glass ingredients during firing, or other suitable materials can be used.

The second ceramic material is adhered by a portion of the first ceramic material penetrating from the base material layer, and thus, the constraining layer is solidified and the base material layer and the constraining layer adjacent to each other are bonded together.

As the second ceramic material, alumina or zirconia can preferably be used. The constraining layer preferably includes the second ceramic material in a non-sintered state having a sintering temperature greater than that of the first ceramic material. Therefore, the constraining layer suppresses the shrinkage in a plane direction in a firing process to the base material layer. As described above, the constraining layer is adhered and bonded by the penetration of a portion of the first ceramic material. Therefore, depending on the state and a desired constraining force of the base material layer and the constraining layer, and sintering conditions, the thickness after firing of the constraining layer is preferably about 1 μm to about 10 μm, for example.

The electrode materials of the discharge electrodes, internal electrode, or via electrode may be any material as long as the material includes, as the main ingredients, conductive ingredients that can be simultaneously fired with the base material layer and various known materials can be used. Specifically, Cu, Ag, Ni, Pd, oxides thereof, and alloys thereof, for example, can preferably be used.

As described above, since the mounting area can be reduced by integrating the ESD protection portion with the insulating substrate, the size of the circuit is effectively reduced. Moreover, by providing the ESD protection portion in the insulating substrate, the wiring distance can be reduced and the ESD protection function can be sufficiently provided.

When the ceramic multilayer substrate is used for the insulating substrate, a substrate including an ESD protection function can be produced without increasing the processes as compared to the case in which the ESD protection device is manufactured using the ceramic multilayer substrate.

In the ESD protection portion, when the mixed portion is defined by a material having an intermediate shrinkage behavior between that of ceramic materials and that of electrode materials by mixing metal materials and ceramic materials arranged between the discharge electrodes and the ceramic multilayer substrate and the gap portion between the ends of the discharge electrodes, stress acting between the discharge electrodes and the ceramic multilayer substrate can be minimized and prevented, disconnection of the discharge electrodes or delamination of the discharge electrodes, separation of the discharge electrodes or a variation in the discharge gap width due to a variation in the shrinkage of the discharge electrodes in the cavity, and short-circuiting are prevented from occurring. Therefore, the firing potential in the ESD protection portion can be accurately set and the reliability of the ESD protection function can be increased.

Further, the capacity of the ESD protection portion is preferably about 0.1 pF or less, for example, and, the impedance between terminals is sufficiently high even in a frequency range of about 300 MHz to several GHz of and the characteristics of other circuits are not adversely affected. Thus, the ESD protection portion can be used in a preliminary stage of an LC filter for high frequencies and can sufficiently provide the ESD protection function.

In a varistor or Zener diode, the electrostatic capacity is about 2 pF greater and an applicable frequency range is up to about 300 MHz. In contrast, since the electrostatic capacity of the ESD protection portion of the substrates including an ESD protection function according to preferred embodiments of the present invention can be reduced up to, for example, about 1/20, an applicable frequency range extends by about 20 times. More specifically, the ESD protection portion can be used in a high frequency range of about 300 MHz to about 6 GHz.

The high frequency IC is a component which is difficult to protect from ESD in that the high frequency IC is easily broken by static electricity and, in contrast, when a capacity of several pF is provided, normal operation cannot be performed. However, since the electrostatic capacity of the ESD protection portion of the substrates including an ESD protection function according to preferred embodiments of the present invention is about 0.1 pF, for example, and thus, the ESD protection portion can be used to protect the high frequency IC.

By providing the ESD protection portion in the ceramic multilayer substrate on which an IC is mounted, the distance between the ESD protection portion and the IC can be reduced and deterioration of the protection function due to the wiring impedance therebetween is prevented.

The present invention is not limited to the above-described preferred embodiments.

For example, a circuit element including not only an inductor (L) or a capacitor (C) but also a resistance (R) may be provided in the insulating substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate including an ESD protection function, the substrate comprising:
 a multilayer insulating substrate including a plurality of laminated insulating layers and at least one of a capacitor element and an inductor element disposed therein;
 at least one cavity provided in the multilayer insulating substrate; and
 at least one pair of discharge electrodes including facing portions arranged in the at least one cavity so that ends thereof face each other with a space therebetween and being electrically connected to the at least one of the capacitor element and the inductor element.

2. The substrate according to claim 1, wherein the multilayer insulating substrate includes a mixed portion disposed near a surface at which the discharge electrodes are arranged, the mixed portion is arranged adjacent to at least the facing portions of the discharge electrodes and the space between the facing portions, the mixed portion including a metal material and an insulating material defining the multilayer insulating substrate.

3. The substrate according to claim 2, wherein the mixed portion is arranged adjacent to only the facing portions and the space between the facing portions.

4. The substrate according to claim 2, wherein, when viewed in a direction in which the facing portions of the discharge electrodes and the mixed portion overlap each other, the mixed portion is arranged in contact with a periphery of the cavity and only inside of the periphery.

5. The substrate according to claim 1, wherein the multilayer insulating substrate is a multilayer ceramic substrate.

6. The substrate according to claim 1, wherein the cavity and the discharge electrode are arranged near a signal input portion of the multilayer insulating substrate.

7. The substrate according to claim 1, wherein the at least one of the capacitor element and the inductor element defines a high frequency circuit.

8. The substrate according to claim 1, wherein an IC is mounted on the multilayer insulating substrate or in the multilayer insulating substrate.

9. The substrate according to claim 1, wherein the at least one pair of discharge electrodes is electrically connected to the at least one of the capacitor element or the inductor element within the multilayer insulating substrate.

* * * * *